(12) United States Patent
Sasaki et al.

(10) Patent No.: US 7,443,143 B2
(45) Date of Patent: Oct. 28, 2008

(54) CONTROLLER OF AC GENERATOR FOR VEHICLE

(75) Inventors: Junya Sasaki, Tokyo (JP); Katsuyuki Sumimoto, Tokyo (JP)

(73) Assignee: Mitsubishi Electric Corp., Tokyo (JP)

( * ) Notice: Subject to any disclaimer, the term of this patent is extended or adjusted under 35 U.S.C. 154(b) by 0 days.

(21) Appl. No.: 11/754,060

(22) Filed: May 25, 2007

(65) Prior Publication Data

US 2008/0100269 A1  May 1, 2008

(30) Foreign Application Priority Data

Oct. 27, 2006  (JP) ............................. 2006-292495

(51) Int. Cl.
*H02H 7/06* (2006.01)
*H02P 9/00* (2006.01)
*H02P 11/00* (2006.01)

(52) U.S. Cl. ............................. 322/24; 322/28; 322/44; 322/59

(58) Field of Classification Search ................... 322/28, 322/24, 45, 44, 89, 14, 59; 363/89; 307/10.1
See application file for complete search history.

(56) References Cited

U.S. PATENT DOCUMENTS

| | | | | |
|---|---|---|---|---|
| 2,334,823 A | * | 11/1943 | Hewitt et al. .................... 303/1 |
| 3,469,168 A | * | 9/1969 | Harland, Jr. et al. ......... 320/123 |
| 4,470,004 A | * | 9/1984 | Morishita et al. .............. 322/99 |
| 4,651,081 A | * | 3/1987 | Nishimura et al. .......... 320/123 |
| 5,243,270 A | * | 9/1993 | Mayumi et al. ................ 322/28 |
| 5,675,237 A | * | 10/1997 | Iwatani ......................... 322/28 |
| 6,275,398 B1 | * | 8/2001 | Sumimoto et al. ............. 363/89 |
| 7,034,508 B1 | * | 4/2006 | Sasaki et al. ................... 322/28 |
| 7,102,332 B1 | * | 9/2006 | Sasaki et al. ................... 322/28 |
| 2002/0185992 A1 | * | 12/2002 | Kouwa .......................... 322/28 |
| 2007/0145950 A1 | * | 6/2007 | Wang ........................... 320/134 |

FOREIGN PATENT DOCUMENTS

JP   57-148541 A   9/1982

* cited by examiner

*Primary Examiner*—Julio Gonzalez
(74) *Attorney, Agent, or Firm*—Sughrue Mion, PLLC

(57) ABSTRACT

A controller of a generator for a vehicle in the invention includes a battery voltage detecting circuit and an output terminal voltage detecting circuit of an AC generator. A value of a detected voltage of the output terminal voltage of the AC generator is set to be higher than a value of a detected voltage of the battery voltage. A diagnosis alarm signal is outputted when the detected voltage of the battery voltage is lower than the set value while the detected voltage of the output terminal is higher than the set value.

6 Claims, 5 Drawing Sheets

FIG. 2

NORMAL TIME (A) USUALLY

POINT B ——————————— ····· H
              ····· L

POINT S ⎍⎍⎍⎍⎍ ····· H
              ····· L (B) WITH FULL LOAD

POINT B ——————————— ····· H
              ····· L

POINT S ——————————— ····· H
              ····· L (C) IN LOAD INTERCEPTION TIME

POINT B ——————————— ····· H
              ····· L

POINT S ——————————— ····· H
              ····· L

FIG. 3

| ABNORMALLY | | |
|---|---|---|
| (A) DISCONNECTION OF CHARGING WIRE | POINT B<br>POINT S | |
| (B) DISCONNECTION OF BATTERY VOLTAGE | POINT B<br>POINT S | |
| (C) INCREASE IN RESISTANCE OF CHARGING WIRE | POINT B<br>POINT S | |
| (D) INCREASE IN VOLTAGE OF BATTERY VOLTAGE DETECTING LINE | POINT B<br>POINT S | |
| (E) DIAGNOSIS ALARM SIGNAL | | |

CONTROLLER OF AC GENERATOR FOR VEHICLE

BACKGROUND OF THE INVENTION

1. Field of the Invention

The present invention relates to a controller of an AC generator for a vehicle, particularly, a controller of an AC generator for a vehicle in which a malfunction of a charging wire or a battery voltage detecting line can be efficiently detected.

2. Description of the Related Art

Up to now, as the above kind of controller of an AC generator for a vehicle, provided having been a controller of an AC generator for a vehicle, the controller capable of well controlling electric generation in accordance with an electric generation voltage or a battery voltage even in the case of disconnection of the generator output line (a battery charging wire). For example, a battery voltage and an output voltage of an electric generator are separately detected to usually put priority on detecting the battery voltage for controlling electric generation, on one hand. On the other hand, the output voltage of the generator is detected to control electric generation in the case of disconnection of the output voltage of the generator while a voltage is adjusted in accordance with the battery voltage when the battery voltage detecting line is disconnected so that each driver can be informed of the respective cases. (Refer to Patent Reference 1, for example.)

Patent Reference 1 is JP-A-S57-148541.

In the above-mentioned conventional technology, however, many comparators are required for detecting that the battery voltage has decreased to a predetermined voltage due to an electric discharge. This causes necessity of forming a complicated logic circuit for carrying out predetermined control of electric generation. The complicated logic circuit causes an IC circuit to be complicated and the area of the IC chip to be increased. Further, it causes a rise in cost since the area of the IC chip is directly reflected in a cost.

Moreover, increase in resistance due to electrolytic corrosion of wiring and the like is considerable as one of malfunction modes around the generator. Influence of the above causes a rise in controlling voltage of the generator and is likely to cause serious problems of a battery or other electronics. In the technology up to now, however, it takes long time to detect a malfunction mode since the battery voltage cannot be detected until it reaches a certain threshold value Vth or less.

SUMMARY OF THE INVENTION

In view of the above, an object of the invention is to use a simple circuitry for achieving detection of a malfunction of a charging wire or a battery voltage detecting line, detection of an increase in resistance of wiring and alarm of the above.

A controller of an AC generator for a vehicle for rectifying an output of the AC generator and supplying an electric load with electric power includes: a battery voltage detecting circuit for detecting a charging voltage of the battery; and an output voltage detecting circuit for detecting the output terminal voltage of the AC generator. In the controller, a detected voltage value of the output terminal voltage of the AC generator is set to be higher than a detected voltage value of the battery voltage and a diagnosis alarm signal is outputted when a detected voltage of the battery voltage is lower than the set value and a detected voltage of the output terminal voltage is higher than the set value.

In accordance with the controller of an AC generator for a vehicle according to the invention, a minimum circuitry allows detection and alarm of a malfunction of a charging wire or a battery voltage detecting line to be performed. This contributes to reduction in area of an IC chip and in cost.

Further, an increase in resistance of wiring can be detected in early stages and a malfunction around a generator can be promptly informed to a driver. Accordingly, damage such as an overcharge of a battery, which is likely to occur in the case of leaving the malfunction as it is, can be prevented before it happens.

The forgoing and other object, features, aspects and advantages of the present invention will become more apparent from the following detailed description of the present invention when taken in conjunction with the accompanying drawings.

BRIEF DESCRIPTION OF THE DRAWINGS

FIG. 2 is a signal diagram in a circuit showing various kinds of operations in normal time in accordance with Embodiment of the invention;

FIG. 3 is a signal diagram in a circuit showing various kinds of operations in abnormal time in accordance with Embodiment of the invention;

DESCRIPTION OF THE EMBODIMENTS

Embodiment 1

Figure 1:
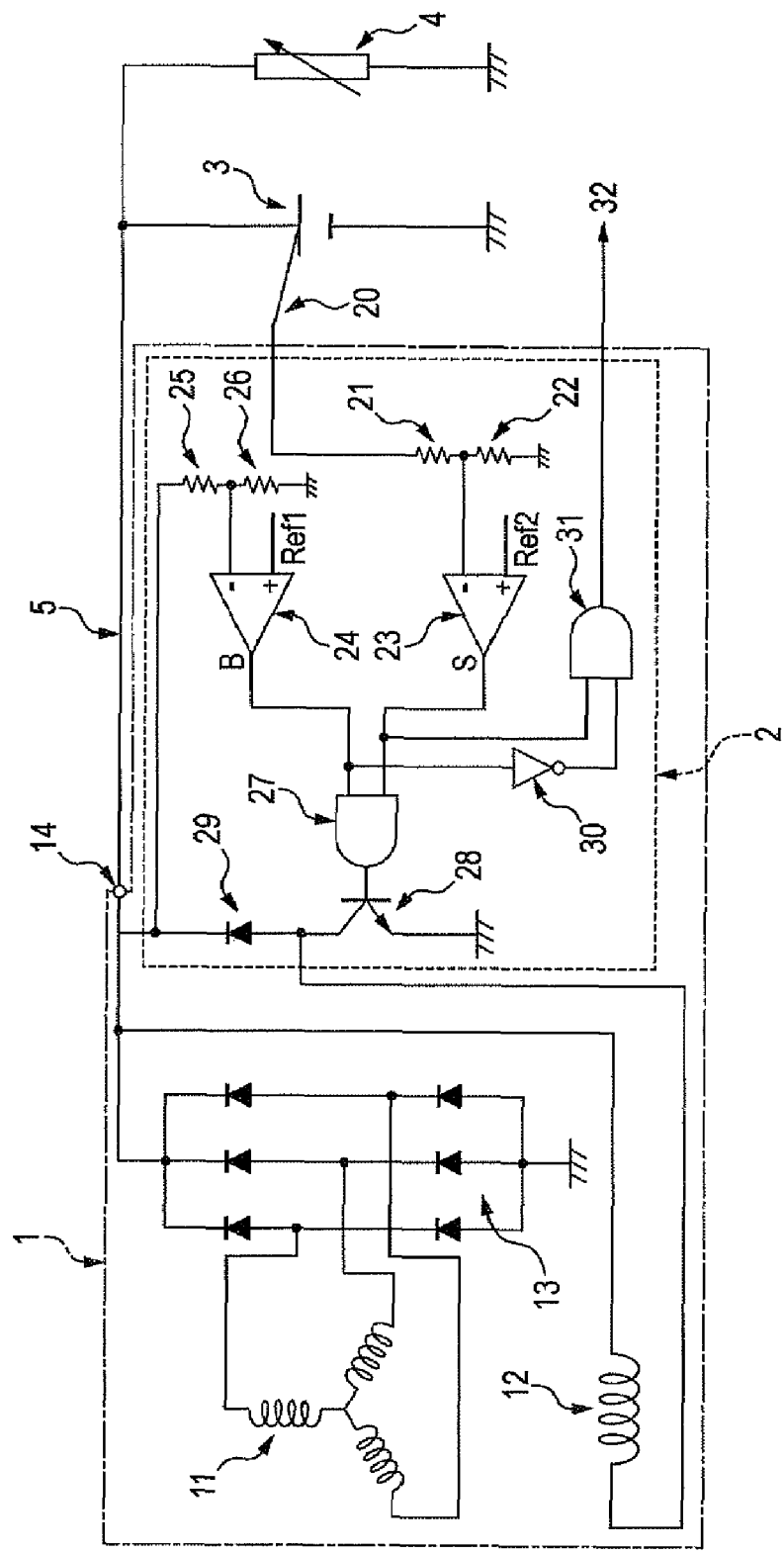
FIG. 1 is a circuit diagram showing a whole structure of a controller of an AC generator for a vehicle in accordance with Embodiment 1 of the invention.

FIG. 1 is a circuit diagram showing a whole structure of a controller of an AC generator for a vehicle in accordance with Embodiment 1. In FIG. 1, an AC generator 1 comprises a stator 11, a rotor 12, a three-phase full-wave rectifier 13 and a voltage controller (a regulator) 2. The rotor 12 is driven for rotation by means of an engine (not shown) to cause the stator 11 to generate three-phase AC electromotive force. The electromotive force generated in the stator 11 is rectified by means of the three-phase full-wave rectifier 13 to be outputted from an output terminal 14 through a charging wire 5 to a battery 3 and an electric load 4. The output voltage of the stator 11 is controlled by means of a voltage controller 2.

The voltage controller 2 will be now described in detail as follows. In the voltage controller 2 in FIG. 1, only extracted is a part relating the invention. The voltage controller 2 monitors a voltage of the battery 3 through a battery voltage detecting line 20. The voltage is divided by means of resistances 21 and 22 to be inputted to a negative phase input terminal of a voltage comparator 23. The divided voltage is compared with a reference voltage Ref2 (generated from inner power source voltage not shown), which is inputted at a positive phase input terminal. A result of the above is outputted to an output terminal (a point S) as a binary signal of H and L.

A voltage comparator 24 similarly monitors an output voltage of the AC generator 1. The voltage is divided by means of resistances 25 and 26 to be inputted to a negative phase input terminal of the voltage comparator 24. A result of comparison of the above with the reference voltage Ref1 inputted to the positive phase input terminal is outputted to an output terminal (a point B). A value of Ref1 at that time is set to be higher than that of Ref2. Values of Ref1=15.5 V and Ref2=14 V are set, for example. Logical products of the points B and S are then generated by means of an AND gate 27. An output signal of the above is used to operate an output transistor 28 to control an electric current flowing in the rotor 12.

A feedback diode 29 is inserted in a direction of stopping the current flowing from the AC output terminal 14 into a transistor 28. An output of the voltage comparator 24 is inputted to one terminal of the AND gate through an inverter gate 30. An output of the voltage comparator 23 is directly inputted to the other terminal of the AND gate to be outputted outside as a diagnosis alarm signal 32.

Now, described will be an operation of the circuitry.

First, a battery voltage is low since no electric generation is carried out from the AC generator 1 at an initial period of inputting a key switch (not shown). The battery voltage is monitored through a battery voltage detecting line 20. A voltage VA divided by means of the resistances 21 and 22 inputs a voltage lower than Ref2 to a negative phase terminal of the voltage comparator 23. Accordingly, a signal on an H level is outputted to a terminal S of the voltage comparator 23. An output voltage of the generator, which is taken in from the output terminal 14, also has a low value. A voltage VB divided by means of the resistance 25 and 26 inputs a voltage lower than Ref 1 to a negative phase terminal of the voltage comparator 24. Accordingly, a signal on the H level is outputted to a terminal B of the voltage comparator 24.

An output of the AND gate 27 is on the H level since both of the output signals at the points S and B are on the H level. The output transistor 28 is turned on to perform initial excitation of the generator 1.

Then, a generated output increases as the number or rotation of an engine rises to increase a voltage of the battery 3. The battery voltage having increased more than Ref2 first causes an output of the voltage comparator 23 to be reversed and a signal at the point S becomes on the L level. On the other hand, an output of the voltage comparator 24 at the point B is kept on the H level since Ref1 is larger than Ref2. An output of the AND gate 27 is reversed to the L level.

This results in turning off of the output transistor 28, a stop of supplying the rotor 12 with field current and reduction of an output voltage of the AC generator 1. Decrease in battery voltage for the second time due to the above to a voltage lower than Ref2 causes the signal at the point S to be on the H level similarly to the above description. The signal at the point S repeats the H level and the L level thereafter.

FIG. 2 illustrates a variety of operations in normal time. In FIG. 2, shown are respective signal states at the points B and S in usual time, full load time and load interception time. In a usual condition (A), a signal at the point S turns on and off as described above while a signal at the point B is kept on the H level. This is because a value of Ref1 is set at a value higher than that of Ref2. The voltage controller 2 operates so that the voltage detected by means of the battery voltage detecting line 20 would be kept constant.

In a full load condition (B), signals at both of the points B and S are on the H level. This is because the generated energy of the generator 1 is short in the full load condition and the battery 3 decreases in voltage below both values of Ref1 and Ref2 due to electric discharge. That is to say, outputs of the voltage comparators 23 and 24 both indicate the H level since the divided voltages VA and VB are both lower than Ref1 and Ref2. The output transistor 28 is turned on to have the rotor 12 being in the full excitation condition. The generated output of the generator 1 is thus raised. In a load interception condition (C), both of the output voltage of the generator and the battery voltage instantaneously rise more than Ref1 and Ref 2, so that both signals at the points B and S become on the L level.

The above is signal states at the points B and S in the case that the generator normally operates. Now, described in FIG. 3 will be signal states at the points B and S in the case that any one of the charging wire 5 and the battery voltage detecting line 20 is in some malfunction mode. First, assumed is a condition (A) that the charging wire 5 is disconnected. In this case, it is impossible to charge the battery 3 from the generator 1. This gradually decreases the battery voltage and makes a signal at the point S be on the H level in the course of time. The output transistor 28 is turned on since the voltage at the point B is also on the H level. The current flowing in the rotor 12 is then increased to contribute to an increase in voltage at the output terminal 14. The output voltage increases finally more than Ref1, so that the voltage at the point B becomes on the L level and the signal at the point B turns on and off as shown in FIG. 3. As a result, the states are settled down so that the signal at the point B would be in the switching state while the signal at the point S would be on the H level as shown on the right side of the FIG. 3.

Second, in a condition (B) that the battery voltage detecting line 20 is disconnected, the voltage VA inputted to the voltage comparator 23 is almost 0 V (<Ref2). As a result, the signal at the point S is on the H level while the output voltage of the generator increases. The signal at the point B turns to the L level and a switching operation is carried out thereafter to control the output voltage of the generator when the output voltage becomes higher than Ref1. The states are finally settled down so that the signal at the point B would be in the switching state while the signal at the point S would be on the H level, as shown on the right side of the FIG. 3.

Thirdly, assumed is a condition (C) that the charging wire 5 increases in resistance due to electrolytic corrosion and such. In this condition, a potential difference between the generator 1 and the battery 3 is enlarged. The potential difference depends on the output current. When resistance of the charging wire increases at a certain output current, a signal state at the point S initially has no change. As a result, the battery voltage is unchanged while an output terminal voltage rises in accordance with an increase in drop of the charging wire. The signal at the point B starts turning on and off when the output terminal voltage continuously rises to be higher than the value of Ref1. The states are settled down so that the signal at the point B would be in the switching state while the signal at the point S would be on the H level as shown on the right side of the FIG. 3 after the output voltage, namely, a charging wire drop voltage becomes smaller than Ref2.

Fourthly, in a condition (D) that the battery voltage detecting line 20 is increased in resistance, an increase in resistance on an upstream side of the resistance 21 causes a change in ratio in dividing voltage. Accordingly, decreases the voltage inputted to the voltage comparator 23. The voltage controller 2 operates so as to make an input value of the voltage comparator 23 Ref2, so that both of the output terminal voltage and the battery voltage increase so as to correspond to the low input. Further increase in resistance causes the output terminal voltage to exceed Ref1. The signal at the point B then starts turning on and off. The signal states are finally settled down so that the signal at the point B is in the switching state while the signal at the point S is on the H level as shown on the right side of the FIG. 2.

As described above, it can be seen that the signals on the points B and S are finally in the same patterns, that is, the signal at the point B is in the switching state while the signal at the point S is on the H level in a mode of abnormal time.

Such states cannot exist in normal time. Accordingly, arranging the inverter gate 30 and the AND gate 31 as shown to form the signals outputted in the above combination of the signal states allows a diagnosis alarm signal shown in FIG. 3E to be outputted to the outside and a driver to be informed of a malfunction.

Embodiment 2

Figure 4:
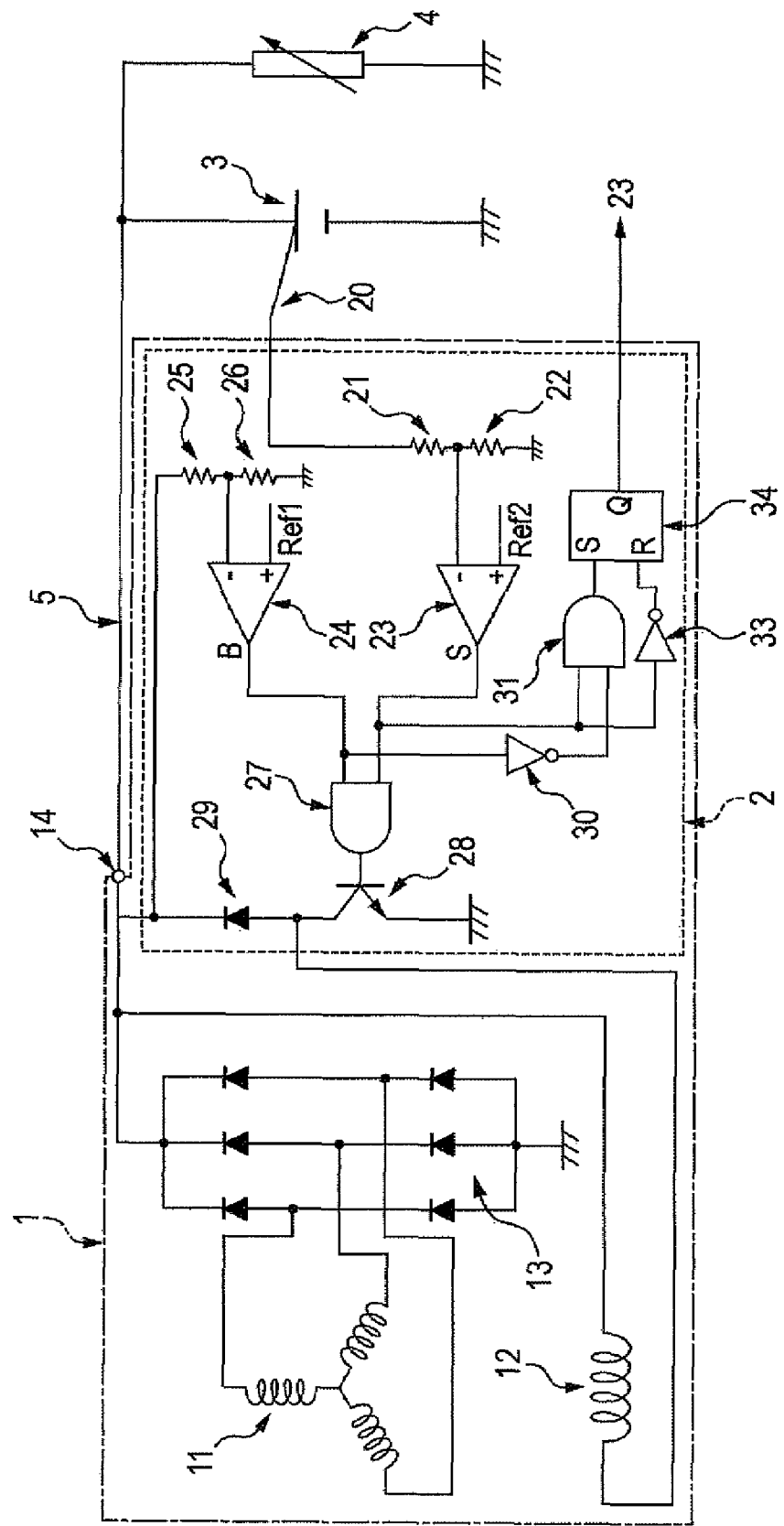
FIG. 4 is a circuit diagram showing a whole structure of a controller of an AC generator for a vehicle in accordance with Embodiment 2 of the invention.

FIG. 4 is a circuit diagram showing a whole structure of a controller of an AC generator for a vehicle in accordance with Embodiment 2 of the invention. In FIG. 4, the reference sings and numerals same as those in FIG. 1 denote the same or equal components. In FIG. 4, a difference from Embodiment 1 is only a point in a circuit for generating the diagnosis alarm signal. That is to say, the diagnosis alarm signal 32 is generated only by means of the inverter gate 30 and the AND gate 31 for the signals at the points B and S in Embodiment 1. In Embodiment 2, however, further added are an inverter gate 33 and a holding circuit 34 for the signal at the point S.

The system in Embodiment 1 has a problem that the outputted diagnosis alarm signal 32 is an on/off signal synchronized with the on/off signal at the point B, and therefore, difficult to handle as a signal. In Embodiment 4, however, the holding circuit 34 is provided at an output stage of the AND gate 31 as shown in FIG. 4. A latch operation is carried out so that the output would be switched from the L level to the H level in the case that the signal at the point S is on the H level and the signal at the point B is on the L level and from the L level to the H level in the case that the signal at the point S is on the L level. This allows a signal to be continuous.

Embodiment 3

Figure 5:
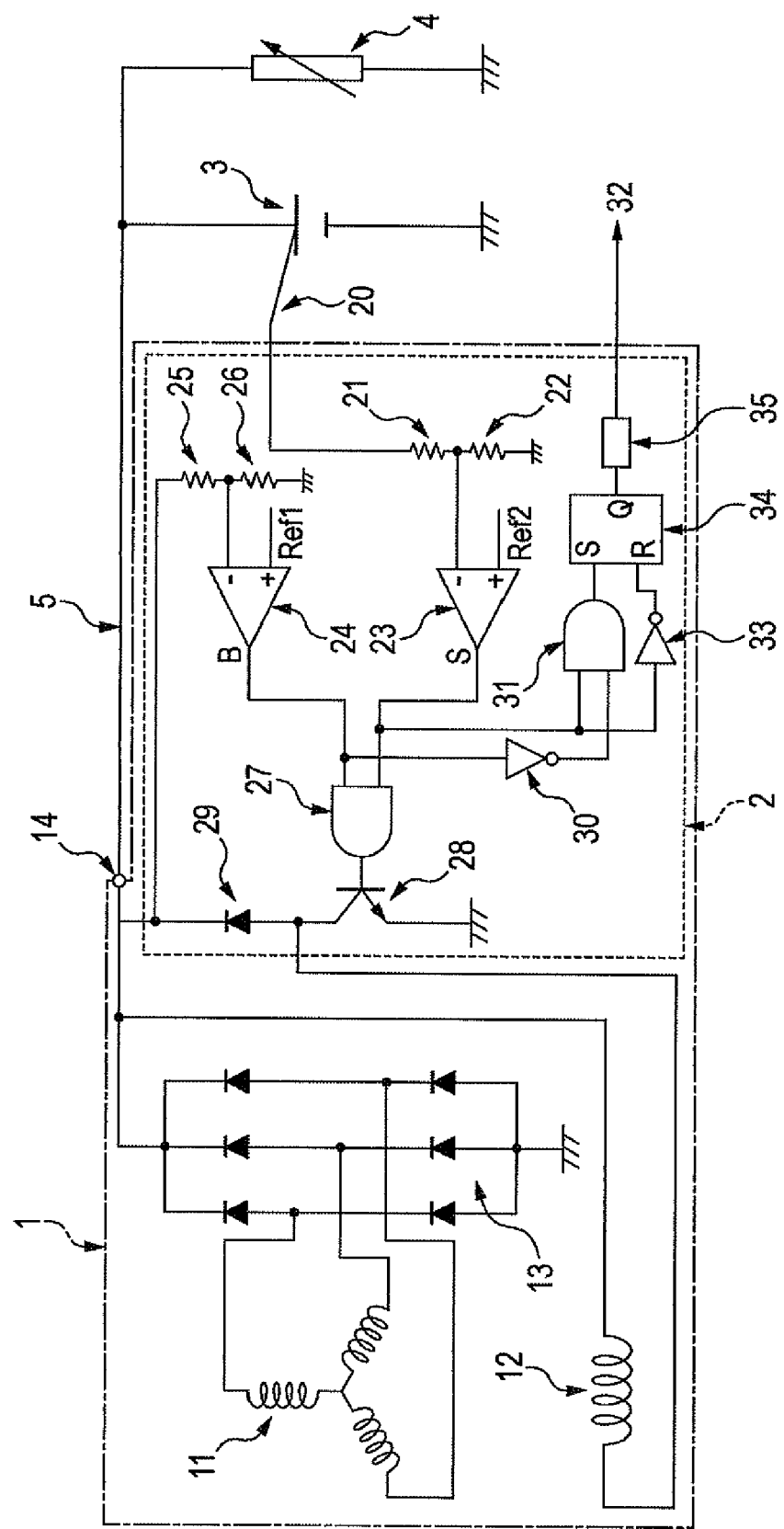
FIG. 5 is a circuit diagram showing a whole structure of a controller of an AC generator for a vehicle in accordance with Embodiment 3 of the invention.

Furthermore, FIG. 5 is a circuit diagram showing a whole structure of a controller of an AC generator for a vehicle in accordance with Embodiment 3 of the invention. In FIG. 5, the sings and numerals same as those of Embodiments 1 and 2 denote the same or equal components. In FIG. 5, a difference from Embodiment 2 is a point that a timer circuit 35 is added in a final stage in the circuit for generating the diagnosis alarm signal. That is to say, a timer 35 is arranged so that the output would be switched from the L level to the H level after a state that the input signal is on the H level at the output stage continues for certain fixed time (one second, for example) and the output would be immediately switched from the H level to the L level when the input signal is changed from the H level to the L level. Such arrangement of the timer 35 allows an incorrect operation of the generator 1 due to a ripple of a voltage and such to be prevented.

Various modifications and alterations of this invention will be apparent to those skilled in the art without departing from the scope and spirit of this invention, and it should be understood that this is not limited to the illustrative embodiments set forth herein.

What is claimed is:

1. A controller of an AC generator for a vehicle for rectifying an output of the AC generator and supplying an electric load with electric power, the controller comprising:
    a battery voltage detecting circuit for detecting a charging voltage of the battery; and
    an output voltage detecting circuit for detecting the output terminal voltage of the AC generator, wherein
    a detected voltage value of the output terminal voltage of the AC generator is set to be higher than a detected voltage value of the battery voltage and
    a diagnosis alarm signal is outputted when a detected voltage of the battery voltage is lower than the set value and a detected voltage of the output terminal voltage is higher than the set value.

2. The controller of an AC generator for a vehicle according to claim 1, wherein
    the output voltage detecting circuit is formed from a first voltage comparator for comparing a detected voltage obtained by dividing resistance of the output terminal voltage of the AC generator with a predetermined first set value,
    the battery voltage detecting circuit is formed from a second voltage comparator for comparing a detected voltage obtained by dividing resistance through a battery voltage detecting line with a predetermined second set value and
    the first set value is set to be higher than the second set value.

3. The controller of an AC generator for a vehicle according to claim 2, wherein
    an output signal of the second voltage comparator intermits in accordance with a detected voltage of the battery voltage to control electric generation of the AC generator in normal time.

4. The controller of an AC generator for a vehicle according to claim 1, wherein
    the diagnosis alarm signal is outputted when a condition is judged to be abnormal in the case that the output signal of the second voltage comparator is constant while the output signal of the first comparator intermits.

5. The controller of an AC generator for a vehicle according to claim 1, comprising
    a latch circuit for outputting a signal when the detected voltage of the battery voltage is lower than the set value and the detected voltage of the output terminal voltage is higher than the set value, the latch circuit also for outputting no signal when the detected voltage of the battery voltage increases more than the set value.

6. The controller of an AC generator for a vehicle according to claim 5, comprising:
    a timer circuit for reflecting an output value after the output signal is outputted for certain fixed time and for immediately reflecting the output value when no output signal is outputted.

* * * * *